United States Patent
Sun

(10) Patent No.: US 9,310,649 B2
(45) Date of Patent: Apr. 12, 2016

(54) ALIGNMENT METHOD OF ALIGNMENT FILM

(71) Applicant: Shenzhen China Star Optoelectronics Technology Co., Ltd., Shenzhen, Guangdong (CN)

(72) Inventor: Shihying Sun, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/427,627

(22) PCT Filed: Sep. 16, 2014

(86) PCT No.: PCT/CN2014/086588
§ 371 (c)(1),
(2) Date: Mar. 11, 2015

(87) PCT Pub. No.: WO2016/026189
PCT Pub. Date: Feb. 25, 2016

(65) Prior Publication Data
US 2016/0054610 A1  Feb. 25, 2016

(30) Foreign Application Priority Data
Aug. 19, 2014 (CN) .......................... 2014 1 0412581

(51) Int. Cl.
*H01L 27/12* (2006.01)
*G02F 1/1337* (2006.01)
*H01L 21/02* (2006.01)

(52) U.S. Cl.
CPC ...... *G02F 1/13378* (2013.01); *G02F 1/133723* (2013.01); *H01L 21/02118* (2013.01); *H01L 27/127* (2013.01); *G02F 2001/133776* (2013.01); *G02F 2001/133792* (2013.01)

(58) Field of Classification Search
CPC .................. H01L 21/02082; H01L 21/02098; H01L 21/64; H01L 21/70; H01L 21/702; H01L 21/71

See application file for complete search history.

(56) References Cited

U.S. PATENT DOCUMENTS

| | | | |
|---|---|---|---|
| 2002/0109806 A1* | 8/2002 | Freeman | G02F 1/1334 349/86 |
| 2006/0076967 A1* | 4/2006 | Matsuda | G01R 1/06711 324/754.07 |
| 2006/0215095 A1* | 9/2006 | Liu | G02F 1/133788 349/124 |
| 2013/0342768 A1* | 12/2013 | Yokoyama | G02F 1/1313 349/1 |
| 2014/0055698 A1* | 2/2014 | Kim | G02F 1/136286 349/39 |

* cited by examiner

*Primary Examiner* — Cheung Lee
(74) *Attorney, Agent, or Firm* — Andrew C. Cheng

(57) ABSTRACT

An alignment method of an alignment film is provided, including: providing a substrate and manufacturing an alignment film on the substrate; implementing laser engraving to the alignment film to form a plurality of micro trenches which are directionally consistent on the alignment film; cleaning the substrate and the alignment film to remove the powders generated by laser engraving; and implementing a following liquid crystal cell process. The method is easy to handle and is capable of preventing the non-uniform rubbing issue existing in the alignment method according to prior art to raise the stability of the alignment and promote the effect of the alignment.

9 Claims, 4 Drawing Sheets

ALIGNMENT METHOD OF ALIGNMENT FILM

FIELD OF THE INVENTION

The present invention relates to a display technology field, and more particularly to an alignment method of an alignment film.

BACKGROUND OF THE INVENTION

Generally, a liquid crystal display panel mainly comprises a Thin Film Transistor Array Substrate (TFT Array Substrate), a Color Filter (CF) substrate and a Liquid Crystal Layer located between the two substrates. The working principle is that the light of backlight module is reflected to generate images by applying driving voltages to the two glass substrate for controlling the rotations of the liquid crystal molecules in the liquid crystal layer.

To obtain more regular alignment of the liquid crystal molecules, Polyimide (PI) alignment films which have been processed with alignment treatment are arranged at sides of the Thin Film Transistor Array Substrate and Color Filter substrate close to the liquid crystal layer. In the PI alignment film processed with alignment treatment, acting forces among the branched chain group and the liquid crystal are stronger so that the liquid crystal molecules can be aligned with a certain polar angle relatively tilted to the PI alignment film surface. This certain polar angle is the pretilt angle of the liquid crystal layer. The pretilt angle can control the alignment of the liquid crystal molecules to prevent the occurrence of the antiphase domains. In some degree, it also can influence the light transmittance-voltage curve of the liquid crystal layer. A proper pretilt angle can reduce the threshold voltage and raise the liquid crystal response speed.

In the manufacture process of the liquid crystal display panel, the alignment of the PI alignment film is an important procedure. The liquid crystal molecules can be aligned in the certain direction and angle. Meanwhile, the quality of the alignment procedure will influence the view angle, the respond speed, the color expression and etc. of the liquid crystal display panel.

The alignment method of the PI alignment film mainly utilizes Rubbing as shown in FIG. 1. The method mainly utilizes a hairy roller 10 to brush a PI alignment film 50 on a glass substrate 30. With the rubbing of the hairy roller 10 to the PI alignment film 50, trenches in a certain direction are formed on the PI alignment film 50 to allow the disordered molecules in the PI alignment film 50 become aligned in a consistent direction. Accordingly, the objective of alignment is accomplished. For the liquid crystal display having different structures, the rubbing direction of the hairy roller 10 is required to amend to form different pretilt angles on the PI alignment film 50

The effect of the present rubbing alignment method relies on the quality of cloth hairs. It is highly demanded to the quality of the cloth hairs. However, no efficient method is proposed to control the quality of the cloth hairs for now. Either of the blended in particles attached on the cloth hairs, the lengths of the cloth hairs, the stretch recovery ability, rubbing force and etc. can directly affect the consistency of the trench directions. Meanwhile, if the hairy roller is not flattening, the pressing degree to the PI alignment film cannot be precisely controlled which can cause the non uniform rubbing and influence the effect of the alignment, either.

Consequently, there is a need to improve the alignment method according to prior art for promoting the stability of the alignment and promote the effect of the alignment.

SUMMARY OF THE INVENTION

An objective of the present invention is to provide an alignment method of an alignment film which is easy to handle and capable of preventing the non-uniform rubbing issue existing in the alignment method according to prior art to raise the stability of the alignment and promote the effect of the alignment.

For realizing the aforesaid objective, the present invention provides an alignment method of an alignment film, comprising steps of:

step 1, providing a substrate, and manufacturing an alignment film on the substrate;

step 2, implementing laser engraving to the alignment film to form a plurality of micro trenches which are directionally consistent on the alignment film;

step 3, cleaning the substrate and the alignment film to remove the powders generated by laser engraving;

step 4, implementing a following liquid crystal cell process.

The substrate is a TFT substrate or a CF substrate.

The alignment film is a PI alignment film.

In the first step, an alignment film basic solution is coated on the substrate and solidified to manufacturing the alignment film.

In the second step, the laser is generated by a laser unit, and the laser unit comprises a plurality of laser heads which are intensively arranged, and each of the laser heads irradiates a laser beam.

All the plurality of laser heads which are intensively arranged are perpendicular to the alignment film, and every two adjacent laser heads are parallel aligned with a regular space in between.

The laser unit is controlled by a control terminal to adjust parameters of the laser, and the parameters of the laser comprises laser output power, duration, moving directions of the laser heads and laser output mode.

The laser parameters are adjusted according to properties and thicknesses of the different alignment films.

The benefits of the present invention are: according to the alignment method of the alignment film provided by the present invention, by implementing laser engraving to the alignment film to form a plurality of micro trenches which are directionally consistent for realizing the alignment. The method is easy to handle and capable of preventing the non-uniform rubbing issue existing in the alignment method according to prior art to raise the stability of the alignment and promote the effect of the alignment.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

In order to better understand the characteristics and technical aspect of the invention, please refer to the following detailed description of the present invention is concerned with the diagrams.

Figure 1:
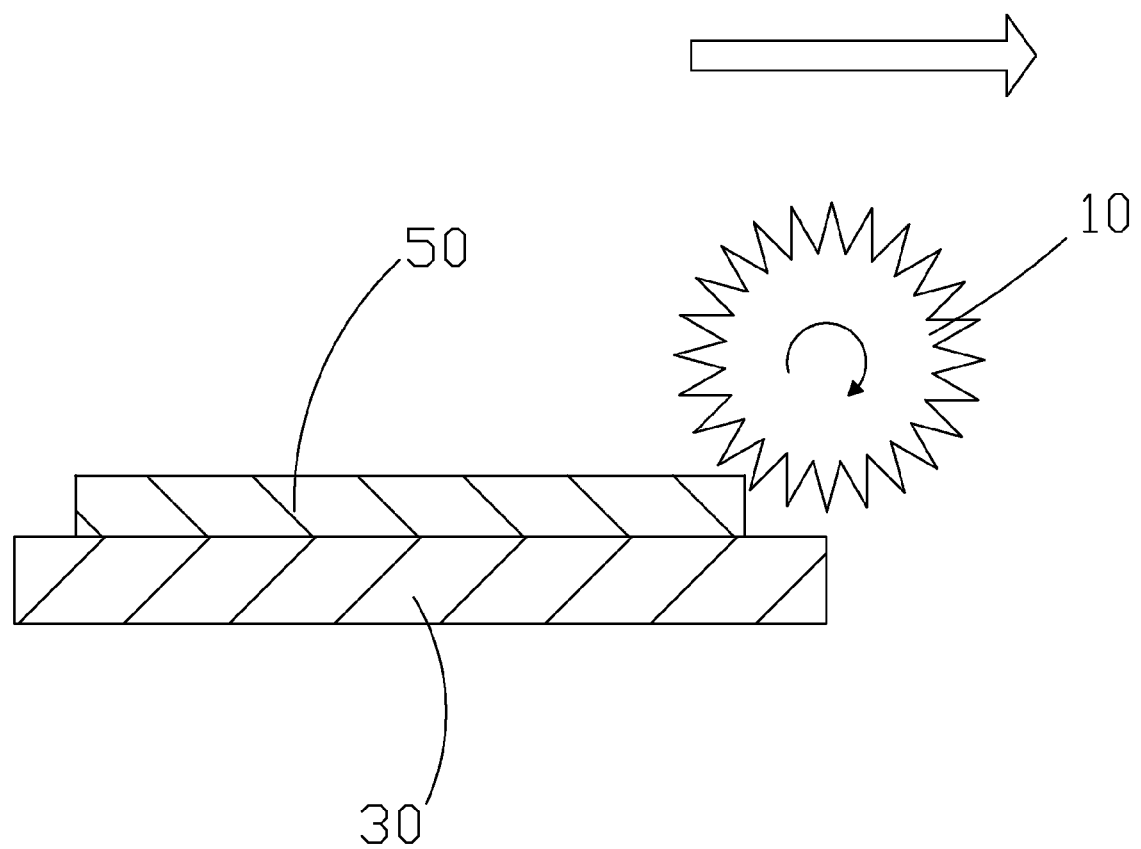
FIG. 1 is a diagram of an alignment method of alignment film according to prior art.
Figure 2:
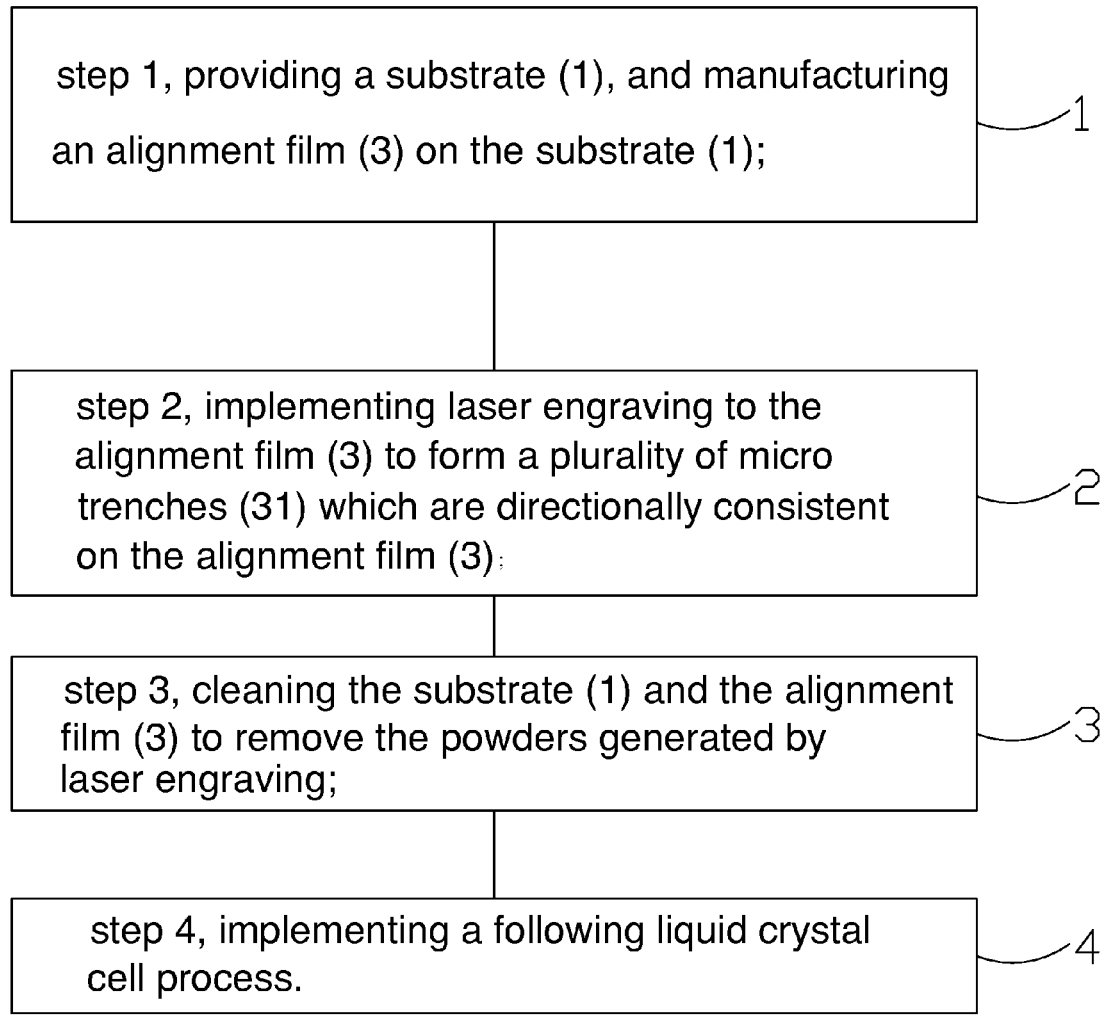
FIG. 2 is a flowchart of an alignment method of alignment film according to the present invention.
Figure 3:
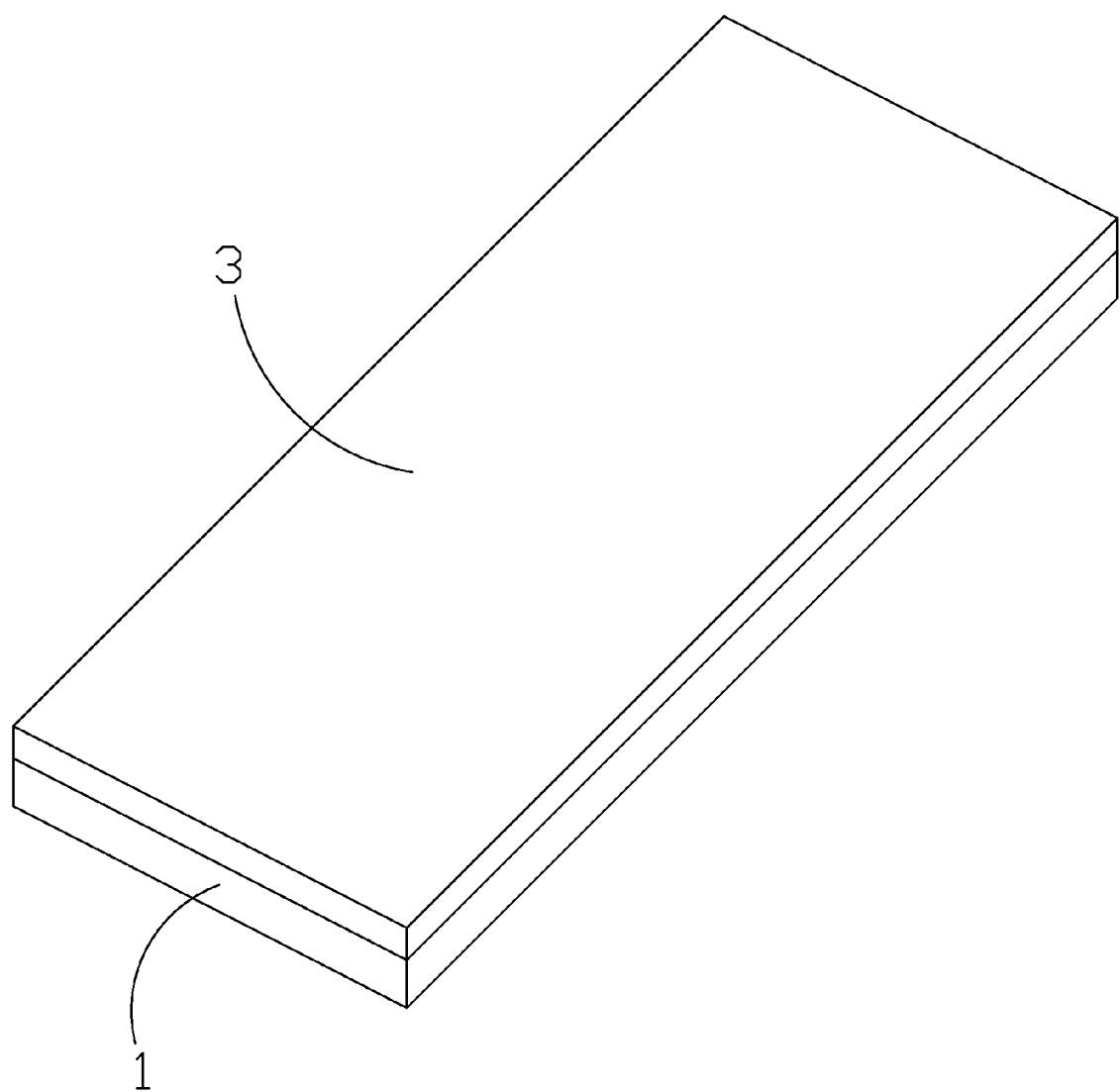
FIG. 3 is a diagram of step 1 in the alignment method of the alignment film according to the present invention.
Figure 4:
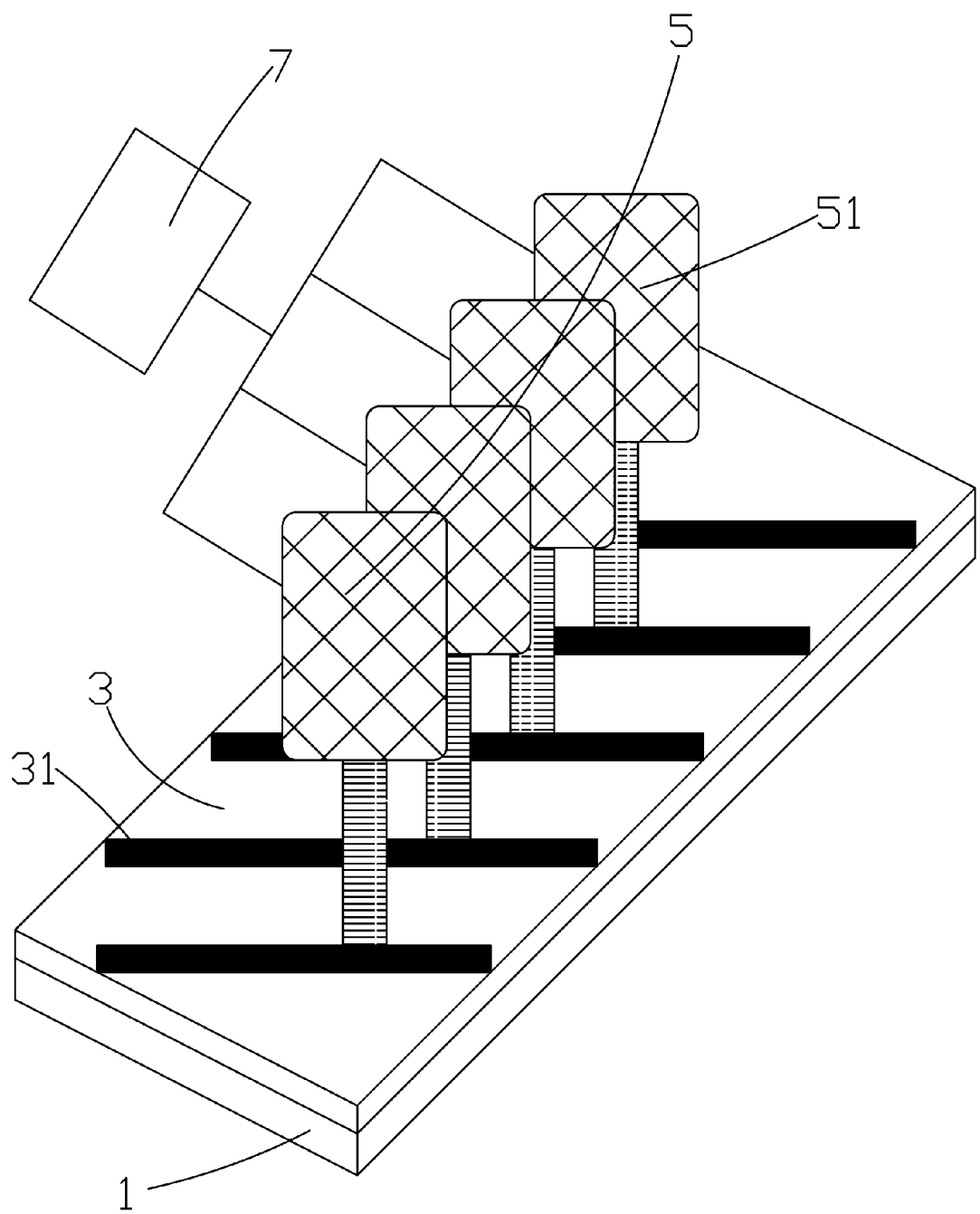
FIG. 4 is a diagram of step 2 in the alignment method of the alignment film according to the present invention.

Please refer from FIG. 2 to FIG. 4. The present invention provides an alignment method of an alignment film, comprising steps of:

step 1, as shown in FIG. 3, providing a substrate 1, and manufacturing an alignment film 3 on the substrate 1.

Specifically, the substrate 1 is a TFT substrate or a CF substrate which the array process is accomplished.

Preferably, the alignment film 3 is a PI alignment film. The main component of the PI alignment film is Polyimide (PI). The procedure of manufacturing the alignment film 3 is to coat an alignment film basic solution on the substrate 1 and implementing a solidifying process to solidify the alignment film basic solution to ultimately form the alignment film 3.

step 2, as shown in FIG. 4, implementing laser engraving to the alignment film 3 to form a plurality of micro trenches 31 which are directionally consistent on the alignment film 3.

In the step 2, the laser for implementing laser engraving to the alignment film 3 is generated by a laser unit 5, and the laser unit 5 comprises a plurality of laser heads 51 which are intensively arranged, and each of the laser heads 51 irradiates a laser beam for implementing laser engraving to the alignment film 3.

Furthermore, all the plurality of laser heads 51 which are intensively arranged are perpendicular to the alignment film 3, and every two adjacent laser heads 51 are parallel aligned with a regular space in between. With the laser engraving, the plurality of the micro trenches 31 formed on the alignment film 3 is directionally consistent. Meanwhile, spaces between every two adjacent micro trenches 31 are equally arranged which is beneficial to the regular alignment of the liquid crystal molecules.

Significantly, the laser unit 5 is controlled by a control terminal 7. The control terminal 7 is capable of controlling and adjusting respective parameters of the laser, such as, laser output power, duration, moving directions of the laser heads 51 and laser output mode (continuously or in pulse). By controlling the parameters of the laser, the characteristics of the directions, depths and etc. of the plurality of micro trenches 31 are precisely controlled and respective characteristics of the plurality of micro trenches 31 can be consistent. Accordingly, the way of implementing alignment to the alignment film 3 by utilizing the laser engraving is easy to handle and has better stability of preventing non-uniform rubbing issue existing in the alignment method according to prior art. The effect of the alignment is fine.

Moreover, according to various factors of different thicknesses, different characteristics of different alignment film 3 and different structures of thin film transistor liquid crystal displays, the respective parameters of the laser can be adjusted via the control terminal 7 to form a plurality of micro trenches 31 which are directionally consistent on the alignment film 3 with by laser engraving to meet different alignment requirements. Therefore, the method possesses properties of easy adjustment and strong adaptability.

step 3, cleaning the substrate 1 and the alignment film 3 to remove the powders generated by laser engraving.

The step 3 is to clean the powders generated by laser engraving in time to prevent the uneven display phenomenon due to the powders.

step 4, implementing a following liquid crystal cell process, such as the foregoing One Drop Filing (ODF), assembly and etc.

The aforesaid alignment method of the alignment film is applicable to thin film transistor liquid crystal displays having Twisted Nematic (TN) structure, Fringe Field Switching (FFS) and In-Plane Switching (IPS) structure.

In conclusion, according to the alignment method of the alignment film provided by the present invention, by implementing laser engraving to the alignment film to form a plurality of micro trenches which are directionally consistent for realizing the alignment. The method is easy to handle and capable of preventing the non-uniform rubbing issue existing in the alignment method according to prior art to raise the stability of the alignment and promote the effect of the alignment.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An alignment method of an alignment film, comprising steps of:
    step 1, providing a substrate, and manufacturing an alignment film on the substrate;
    step 2, implementing laser engraving to the alignment film to form a plurality of micro trenches which are directionally consistent on the alignment film, the micro trenches being spaced from each other in such a way that spaces between every two adjacent micro trenches are equally arranged;
    step 3, cleaning the substrate and the alignment film to remove the powders generated by laser engraving;
    step 4, implementing a following liquid crystal cell process.

2. The alignment method of the alignment film according to claim 1, wherein the substrate is a TFT substrate or a CF substrate.

3. The alignment method of the alignment film according to claim 1, wherein the alignment film is a PI alignment film.

4. The alignment method of the alignment film according to claim 1, wherein in the first step, an alignment film basic solution is coated on the substrate and solidified to manufacturing the alignment film.

5. The alignment method of the alignment film according to claim 1, wherein in the second step, the laser is generated by a laser unit, and the laser unit comprises a plurality of laser heads which are intensively arranged, and each of the laser heads irradiates a laser beam.

6. The alignment method of the alignment film according to claim 5, wherein all the plurality of laser heads which are intensively arranged are perpendicular to the alignment film, and every two adjacent laser heads are parallel aligned with a regular space in between.

7. The alignment method of the alignment film according to claim 5, wherein the laser unit is controlled by a control terminal to adjust parameters of the laser, and the parameters of the laser comprises laser output power, duration, moving directions of the laser heads and laser output mode.

8. The alignment method of the alignment film according to claim 7, wherein the laser parameters are adjusted according to properties and thicknesses of the different alignment films.

9. An alignment method of alignment film, comprising steps of:
- step 1, providing a substrate, and manufacturing an alignment film on the substrate;
- step 2, implementing laser engraving to the alignment film to form a plurality of micro trenches which are directionally consistent on the alignment film, the micro trenches being spaced from each other in such a way that spaces between every two adjacent micro trenches are equally arranged;
- step 3, cleaning the substrate and the alignment film to remove the powders generated by laser engraving;
- step 4, implementing a following liquid crystal cell process;
- wherein the substrate is a TFT substrate or a CF substrate;
- wherein the alignment film is a PI alignment film;
- wherein in the first step, an alignment film basic solution is coated on the substrate and solidified to manufacturing the alignment film;
- wherein in the second step, the laser is generated by a laser unit, and the laser unit comprises a plurality of laser heads which are intensively arranged, and each of the laser heads irradiates a laser beam;
- wherein all the plurality of laser heads which are intensively arranged are perpendicular to the alignment film, and every two adjacent laser heads are parallel aligned with a regular space in between;
- wherein the laser unit is controlled by a control terminal to adjust parameters of the laser, and the parameters of the laser comprises laser output power, duration, moving directions of the laser heads and laser output mode;
- wherein the laser parameters are adjusted according to properties and thicknesses of the different alignment films.

* * * * *